(12) United States Patent
Nakamura

(10) Patent No.: US 6,570,788 B1
(45) Date of Patent: May 27, 2003

(54) SEMICONDUCTOR DEVICE AND METHOD OF DRIVING AND METHOD OF PRODUCING THE SAME

(75) Inventor: Akihiro Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 69 days.

(21) Appl. No.: 09/675,078

(22) Filed: Sep. 28, 2000

(30) Foreign Application Priority Data

Sep. 29, 1999 (JP) ............................................ 11-277326

(51) Int. Cl.$^7$ .............................................. G11C 16/04
(52) U.S. Cl. ............................ 365/185.18; 365/185.27; 365/185.29
(58) Field of Search ....................... 365/185.01, 185.02, 365/185.09, 185.11, 185.17, 185.18, 185.24, 185.26, 185.27, 185.29, 185.33

(56) References Cited

U.S. PATENT DOCUMENTS

| | | | |
|---|---|---|---|
| 5,517,453 A | * 5/1996 | Strain et al. ............ | 365/185.33 |
| 5,774,400 A | * 6/1998 | Landcaster et al. ..... | 365/185.29 |
| 5,956,289 A | * 9/1999 | Norman et al. ......... | 365/185.27 |
| 5,999,444 A | * 12/1999 | Fujiwara et al. ........ | 365/185.02 |
| 6,301,155 B1 | * 10/2001 | Fujiwara ................. | 365/185.02 |

* cited by examiner

*Primary Examiner*—Trong Phan
(74) *Attorney, Agent, or Firm*—Robert J. Depke; Holland & Knight LLC

(57) ABSTRACT

A semiconductor device capable of achieving a cost reduction by increasing the common steps in the production of different kinds of transistors in addition to reducing the area of the memory peripheral circuit, comprising a first voltage supplying circuit, as a write and erase circuit for supplying a write voltage or an erase voltage to non-volatile memory transistors, dividing the write voltage to a first and a second voltage and supplying the first voltage to a gate electrode (word line) at the time of a write operation and for dividing the erase voltage to a third and fourth voltage and supplying the third voltage at an opposite polarity from the first voltage to the word line at the time of an erase operation, and a second voltage supply circuit for applying the second voltage at an opposite polarity from the time of applying the first voltage to the semiconductor substrate or well at the time of a write operation and for applying the fourth voltage at an opposite polarity from the time of applying the third voltage to the semiconductor substrate or well at the time of an erase operation.

10 Claims, 17 Drawing Sheets

FIG.8

| VOLTAGE / MODE | Va | Vb | Vc | P | E_ | Vd | Ve |
|---|---|---|---|---|---|---|---|
| READ | 5V | 0~2V | 0V | 0V | 5V | 1~3V | 0V |
| WRITE | 5V | 0~2V | 0V | $V_{PP}/2$ | 5V | $V_{PP}/2$ | 0V |
| ERASE | 0V | −2~0V | 5V | 0V | $-V_{PP}/2$ | 0V | $-V_{PP}/2$ |

FIG.14

| | COMMON MASK & EXCLUSIVE MASK FOR MONOS-TYPE | EXCLUSIVE MASK FOR VPP/2-TYPE (RELATED ART: EXCLUSIVE FOR VPP-TYPE) | MASK EXCLUSIVELY FOR VCC SYSTEM Tr REQUIRED IN RELATED ART |
|---|---|---|---|
| 1 | ① TRE | | |
| 2 | ② AIM | | |
| 3 | ③ DNW | | |
| 4 | | | LV-PWL |
| 5 | | | LV-NWL |
| 6 | ④ PWL | | |
| 7 | ⑤ NWL | | |
| 8 | ⑥ MVA | | |
| 9 | ⑦ SEL-VA | | |
| 10 | | ⑧ GTET(ONO-ET) | |
| 11 | | | 2GTET(HV-OX-ET) |
| 12 | ⑨ BN | | |
| 13 | ⑩ BN2(N+II) | | |
| 14 | ⑪ 1PS | | |
| 15 | | | NGT |
| 16 | | | PGT |
| 17 | ⑫ Ch-stp | | |
| 18 | | ⑬ HV-NLD | |
| 19 | | ⑭ HV-PLD | |
| 20 | | | LV-NLD |
| 21 | | | LV-PLD |
| 22 | ⑮ NSD | | |
| 23 | ⑯ PSD | | |
| 24 | ⑰ 1AC | | |
| 25 | ⑱ 1AL | | |
| 26 | ⑲ PAD | | |
| | 16 | 3 | 7 |
| | _____ 19 IN TOTAL _____ | | |

MASK No. OF PROCESS IN RELATED ART (left column)
① ~ ⑲ MASK No. IN PRESENT EMBODIMENT

[LINEAR REGION]   $Id = W/L \cdot ueff \cdot Cox[(Vgs-Vth)Vds - 1/2 Vds^2]$

[SUTUATION REGION]   $Id = 1/2 \cdot W/L \cdot ueff \cdot Cox[(Vgs-Vth)^2]$

AT WRITING

AT DELETING

SEMICONDUCTOR DEVICE AND METHOD OF DRIVING AND METHOD OF PRODUCING THE SAME

RELATED APPLICATION DATA

The present application claims priority to Japanese Application No. P11-277326 filed Sep. 29, 1999, which application is incorporated herein by reference to the extent permitted by law.

BACKGROUND OF THE INVENTION

1. Field of the Invention

The present invention relates to a semiconductor device having a non-volatile memory transistor with a gate electrode stacked on a semiconductor substrate or well via an insulating film including an charge storing means therein and a semiconductor device provided with a logic circuit block and a memory block together.

Also, the present invention relates to a method of driving and method of producing the semiconductor device.

2. Description of the Related Art

In non-volatile memory devices, there are known a floating gate (FG) type, a metal-oxide-nitride-oxide-semiconductor (MONOS) type, a metal-nitride-oxide-semiconductor (MNOS) type, etc. corresponding to the types of charge storing means and stacked structure of the insulating film including the charge storing means in the memory transistor.

In a non-volatile memory transistor of the FG type, a floating gate comprised of polycrystalline silicon etc. is stacked on a semiconductor substrate or well via an insulating film, and, further, a control gate is stacked on the floating gate via an inter-gate insulating film comprised for example of an oxide-nitride-oxide (ONO) film.

In a non-volatile memory transistor of the MONOS type, a tunnel insulating film comprised for example of a silicon oxide film or nitrided oxide film, an interlayer insulating film comprised of a nitride film or an oxynitride film, and a top insulating film comprised of a silicon oxide film are stacked in that order on a semiconductor substrate or well, and a gate electrode is formed on the top insulating film.

On the other hand, non-volatile memory devices may be roughly divided by type of memory cell array into a NAND type and an NOR type.

In NAND type non-volatile memory devices, a write and erase operation are currently mainly performed by applying a high voltage between the semiconductor substrate or well and the gate electrode and utilizing Fowler Nordheim (FN) tunneling on the entire surface of the channel.

FIGS. 17A and 17B schematically show a general method for setting the bias of an FG type memory transistor at the time of a write operation and an erase operation.

At the time of a write operation shown in FIG. 17A, a write voltage $V'_{pp}$ is applied to a control gate CG in a state where the semiconductor substrate or well is held at the ground potential. At this time, a source impurity region and drain impurity region are both held at the ground potential.

As a result, a high electric field is applied to the semiconductor substrate or well, so an inversion layer (channel) is formed in its surface portion, and electrons are injected in the floating gate FG by tunneling through the gate insulating film on the entire surface of the channel. When electrons are sufficiently injected into the floating gate FG, the memory transistor shifts from the erase state of a low threshold voltage to the write state of a high threshold voltage.

On the other hand, at the time of an erase operation shown in FIG. 17B, an erase voltage $V_{pp}'$ is applied to the semiconductor substrate or well in a state where the control gate CG is grounded. At this time, the source impurity region and the drain impurity region are both held in a floating state.

As a result, electrons stored in the floating gate FG are withdrawn to the semiconductor substrate or well at the entire channel surface, and the memory transistor shifts to the erase state of a low threshold voltage.

The write and erase methods are basically the same regardless of differences in the types of charge storing means or memory cell arrays when performed over the entire channel surface.

Note that while about 8 nm is considered to be the limit in the FG type for reducing the thickness of a tunnel insulating film from the viewpoint of mainly the deterioration of the charge holding characteristic, in the MONOS type etc. where the charge storing means are made disperse, the data holding characteristic is excellent and the tunnel insulating film can be made thinner. Therefore, while the write or erase voltage is about 20V in the FG type, it can be reduced down to close to 10V in the MONOS type.

Note that in a so-called AND type, one type of NOR type, although there is a slight difference of grounding or leaving open the source and drain impurity regions, the write or erase operation is basically performed in the same way as in FIGS. 17A and 17B.

For this write or erase operation, a booster circuit for boosting an external power source voltage to generate a write voltage $V_{pp}$ or erase voltage $V_{pp}'$ is provided in the non-volatile memory device.

Summarizing the problems to be solved by the invention, in non-volatile memory devices of the related art using the above write and erase method, however, although there is the advantage that the booster circuit can be made configured simply since boosting a negative voltage is unnecessary, a transistor with a high breakdown voltage specification, called a $V_{pp}$-type transistor, is necessary. Therefore, at the present time, the production process is complex and progress cannot be made in reducing costs.

For example, an output transistor etc. of a circuit for driving a word line potential or well potential has to switch between the full range of a high voltage $V_{pp}$ or $V_{pp}'$ at the time of a write or erase operation. Thus, a $V_{pp}$-type transistor has to be used.

Compared with a memory transistor, $V_{cc}$-type (external power source voltage using type) transistor, etc., a $V_{pp}$-type transistor has a large gate length and gate insulating film thickness in accordance with the required breakdown voltage and is set to a large gate width in proportion to the gate length to obtain the necessary drive ability.

Also, the source and drain impurity regions have to be set deeper compared with a memory transistor or $V_{cc}$-type transistor.

Further, frequent use is made of a structure, called an "offset structure", where high concentration source and drain impurity regions are formed away from the gate end.

Therefore, the area occupied by the transistor is large and a special process not included in the production of a memory transistor or $V_{cc}$-type transistor becomes required. This has become a major factor behind why not much progress can be made in reducing the costs of non-volatile memory transistors.

On the other hand, in so-called system LSIs etc., there has recently been active development of semiconductor devices embedded logic circuit blocks and memory blocks.

Since there are a large number of transistors and the operating speed is considered important in a logic circuit block, a $V_{cc}$-type high speed transistor formed at the limit resolution of patterning in the same way as a memory transistor and formed with a thin gate insulating film is used as the transistor for the logic operations.

In such LSIs, transistors are optimized in the logic circuit block to make the area as small as possible. On the other hand, it is necessary to separately form three types of gate insulating films in the wafer, that is, for memory transistor use, high voltage use, and low voltage use, so the production process becomes further complex.

SUMMARY OF THE INVENTION

An object of the present invention is to provide a semiconductor device increased in the degree of compatibility of production processes among different kinds of transistors and thereby able to be reduced in cost, a method of driving and method of producing the same.

According to a first aspect of the present invention, there is provided a semiconductor device comprising a memory transistor formed by stacking a gate electrode on a semiconductor substrate or a well via an insulating film including a charge storing means therein; and a write and erase circuit for supplying a write voltage or an erase voltage between said gate electrode and said semiconductor substrate or well at the time of a write or erase operation on the memory transistor; wherein said write and erase circuit comprises; a first voltage supply circuit for dividing said write voltage to a first and a second voltage and supplying the first voltage to said gate electrode at the time of a write operation and for dividing said erase voltage to a third and a fourth voltages and supplying the third voltage at an opposite polarity from said first voltage to said gate electrode at the time of an erase operation; and a second voltage supply circuit for applying said second voltage at an opposite polarity from the time of applying said first voltage to said semiconductor substrate or well at the time of a write operation and applying said fourth voltage at an opposite polarity from the time of applying said third voltage to said semiconductor substrate or well at the time of an erase operation.

Preferably, the first voltage and second voltage are the same; and the third voltage and fourth voltage are the same.

Preferably, a plurality of insulating films are stacked between the gate electrodes and the well; and planarly dispersed charge storing means are formed in the stacked insulating films.

According to a second aspect of the present invention, there is provided a semiconductor device comprising a memory cell array having a plurality of memory transistors formed by stacking gate electrodes on a semiconductor substrate or a well via insulation layers including charge storing means, and a peripheral circuit including transistors for controlling the memory cell array; wherein a breakdown voltage of the transistors in the peripheral circuits corresponds to a power source voltage input from the outside.

According to a third aspect of the present invention, there is provided a semiconductor device comprising: a memory block; and a logic circuit block having logic transistors; wherein said memory block includes memory transistors formed by stacking gate electrodes on a semiconductor substrate or a well via an insulating film including charge storing means therein, and a peripheral circuit having transistors for controlling the memory transistors; and wherein breakdown voltages of the transistors in said peripheral circuit and the logic transistors in said logic circuit block correspond to a power source voltage input from the outside.

According to a fourth aspect of the present invention, there is provided a semiconductor device comprising: a memory cell array comprised of a plurality of memory transistors formed by stacking gate electrodes on a semiconductor substrate or a well via an insulating film including charge storing means, and a peripheral circuit having transistors for controlling the memory cell array; wherein the transistors in said peripheral circuit are set to the same conditions of at least the gate insulating film thickness and distributions of impurity concentration in the depth direction of source and drain regions and a channel-forming region in said semiconductor substrate or well.

According to a fifth aspect of the present invention, there is provided a semiconductor device comprising a memory block comprised of a memory cell array having a plurality of memory transistors and a peripheral circuit including a write and erase circuit, and a logic circuit block; wherein said peripheral circuit has transistors and said logic circuit has logic transistors; and wherein a thickness of the gate insulating film of the transistors in said peripheral circuit is set the same as the gate insulating film of the logic transistors in said logic circuit block.

According to a sixth aspect of the present invention, there is provided a method of driving a semiconductor device supplying a write voltage or an erase voltage to be applied between a gate electrode and a semiconductor substrate or well at the time of a write or erase operation on a memory transistor formed by stacking a gate electrode on said semiconductor substrate or well via an insulating film including a charge storing means therein, said method including: the steps of, at the time of a write operation; dividing said write voltage to a first and a second voltage; applying the first voltage to said gate electrode; and applying said second voltage at an opposite polarity from when applying said first voltage to said well; and the steps of, at the time of an erase operation; dividing said erase voltage to a third and a fourth voltage; applying the third voltage at an opposite polarity from when applying the first voltage to said gate electrode; and applying the fourth voltage at an opposite polarity from when applying said second voltage to said well.

According to a seventh aspect of the present invention, there is provided a method of producing a semiconductor device comprising a memory block and a logic circuit block, said memory block comprised of a memory cell array having a plurality of memory transistors formed by stacking gate electrodes on a semiconductor substrate or well via an insulating film including charge storing means therein and a peripheral circuit including a write and erase circuit for dividing a write voltage or an erase voltage to be applied between a said gate electrode and said semiconductor substrate or well to a positive voltage and a negative voltage and applying the positive voltage to one of said gate electrode and said semiconductor substrate or well and the negative voltage to the other at the time of a write or erase operation on said memory transistor, said method including the step of: forming transistors in the peripheral circuit including said write and erase circuit and transistors in said logic circuit block at the same time in a same process using the same mask.

According to an eighth aspect of the present invention, there is provided a method of producing a semiconductor device comprising a memory block and a logic circuit block, said memory block comprised of a memory cell array having a plurality of memory transistors formed by stacking gate electrodes on a semiconductor substrate or well via an insulating film including charge storing means therein and a peripheral circuit including a write and erase circuit for dividing a write voltage or an erase voltage to be applied between a said gate electrode and said semiconductor substrate or well to a positive voltage and a negative voltage and applying the positive voltage to one of said gate electrode and said semiconductor substrate or well and the negative voltage to the other at the time of a write or erase operation on said memory transistor, said method including the step of: forming a gate insulating film of transistors in the peripheral circuit including said write and erase circuit and a gate insulating film of transistors in said logic circuit block at the same time in the same process.

In the aspects of the semiconductor device and the method of driving it described above, there are specific necessary values corresponding to the type and structure of the memory transistor at the time of a write or erase operation. Also, the write voltage or erase voltage applied between the gate electrode and the semiconductor substrate or well is applied divided to positive and negative voltages. Accordingly, for example, when the write voltage and the erase voltage are made $V_{pp}$, it is possible to reduce the maximum amplitude of the voltage applied at the time of a write or erase operation to word lines connected to the gate electrode down to $V_{pp}/2$. Therefore, the breakdown voltage of the transistor can be reduced to about half of that in the related art in a peripheral circuit for applying the write voltage and erase voltage to the word line or well.

As a result of reducing the breakdown voltage, the size of the transistor can be made remarkably smaller. Also, in a MONOS type or other semiconductor device with planarly dispersed charge storing means, since the write voltage and erase voltage can inherently be made smaller than those in the FG type, internal boosting is not necessary in some cases.

Due to the above, the area of the peripheral circuits can be reduced by the present invention.

On the other hand, in the method of producing a semiconductor device according to the present invention, the transistors in the peripheral circuits and the transistors in a logic circuit block are produced by at least collectively forming the gate insulating films and by preferably by using all processes in common. Normally, transistors in a logic circuit block are optimized in transistor structure and made smaller for reducing the voltage and increasing the speed. Therefore, the size of transistors comprising the logic circuit block may become larger than the related art due to application of the present invention. However, by applying the present invention, the area of the peripheral circuits can be reduced as explained above and the production process can be made much simpler resulting in a large reduction in manufacturing costs. Accordingly, in the semiconductor device according to the present invention, the chip cost can be reduced compared with the related art.

BRIEF DESCRIPTION OF THE DRAWINGS

These and other objects and features of the present invention will become clearer from the following description of the preferred embodiments given with reference to the accompanying drawings, in which:

FIG. 8 is a table of conditions of voltage to be applied to terminals in the circuit shown in FIG. 7;

FIG. 14 is a table of photo masks used in producing a semiconductor device according to an embodiment of the present invention;

DESCRIPTION OF THE PREFERRED EMBODIMENTS

Below, preferred embodiments of the present invention will be described with reference to the accompanying drawings.

An embodiment of the present invention will be explained by taking as an example an NOR type non-volatile memory device having a MONOS type memory transistor and having source lines and bit lines classified into a hierarchy (hereinafter, referred to as an AND type for convenience).

Figure 1:
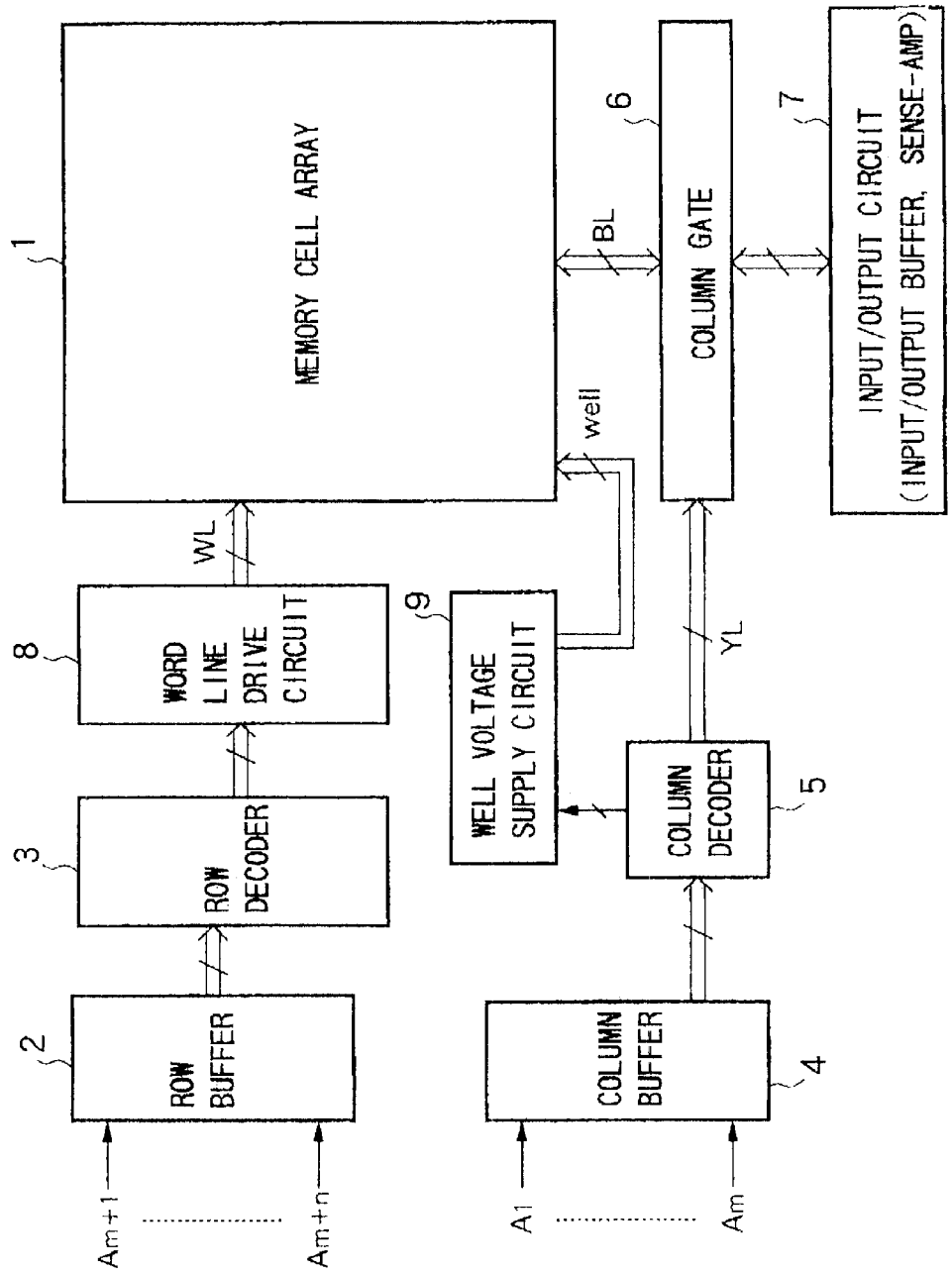
FIG. 1 is a block diagram of the schematic configuration of a memory block of a semiconductor device according to an embodiment of the present invention.

A semiconductor device according to this embodiment of the present invention comprises a memory block and a logic circuit block. FIG. 1 shows the schematic configuration of the memory block.

The memory block comprises, as shown in FIG. 1, a memory cell array 1, a row buffer 2, a row decoder 3, a column buffer 4, a column decoder 5, a column gate 6, an input/output buffer and sense-amplifier group (hereinafter, referred to as an input/output circuit) 7, and a write and erase circuit (word line drive circuit 8 and well voltage supply circuit 9).

The configuration itself is basically the same as in the memory block of a non-volatile memory device of the related art. The functions of the parts of the configuration at the time of a write and erase operation will be described in brief below.

First, in the state with a not shown chip enable signal at "high (H)", an address signal (A1 to Am+n) input to an address terminal is input to the row decoder 3 and the column decoder 5 via address buffers (the row buffer 2 and column buffer 4).

Part of the input address signal is decoded by the row decoder 3, a predetermined word line WL specified by the address signal is selected, and a predetermined high level voltage is applied to the selected word line WLsel. Particularly, at the time of a write operation, a predetermined voltage is applied to the selected word line WLsel from the word line drive circuit 8. At the time of an erase operation, a write inhibit voltage of, for example, about half the predetermined voltage to be applied to the write cell is applied to the non-selected word lines WLunsel, while the selected word line WLsel is held at 0V.

The remaining address signal is decoded by the column decoder 5, a column select line YL in the selected column specified by the address signals is selected, and a predetermined high level voltage is applied to it.

By applying a predetermined voltage to the column select line YL, a predetermined bit line select transistor in the column gate 6 shifts to an ON state. In accordance with this, the selected bit line BLsel is connected to the input/output buffer in the input/output circuit 7.

As a result, at the time of a write operation, the write data in the input/output buffer is supplied to the selected bit line BLsel and written in the memory cell positioned at the intersection of the same and the activated selected word line WLsel.

In the AND type of this example, the entire memory cell array or a predetermined entire block is erased all together. When erasing an entire block, as will be explained later on, in the case that the well is divided into long parallel stripes in the bit line direction, a stripe part of the well may be selected by using the column address as shown in the figure.

In any case, a predetermined voltage is supplied from the well voltage supply circuit 9 to the well at the time of write and erase operations. Due to this, a write voltage or erase voltage is applied between the gate electrode of the memory transistor and the well.

Figure 2:
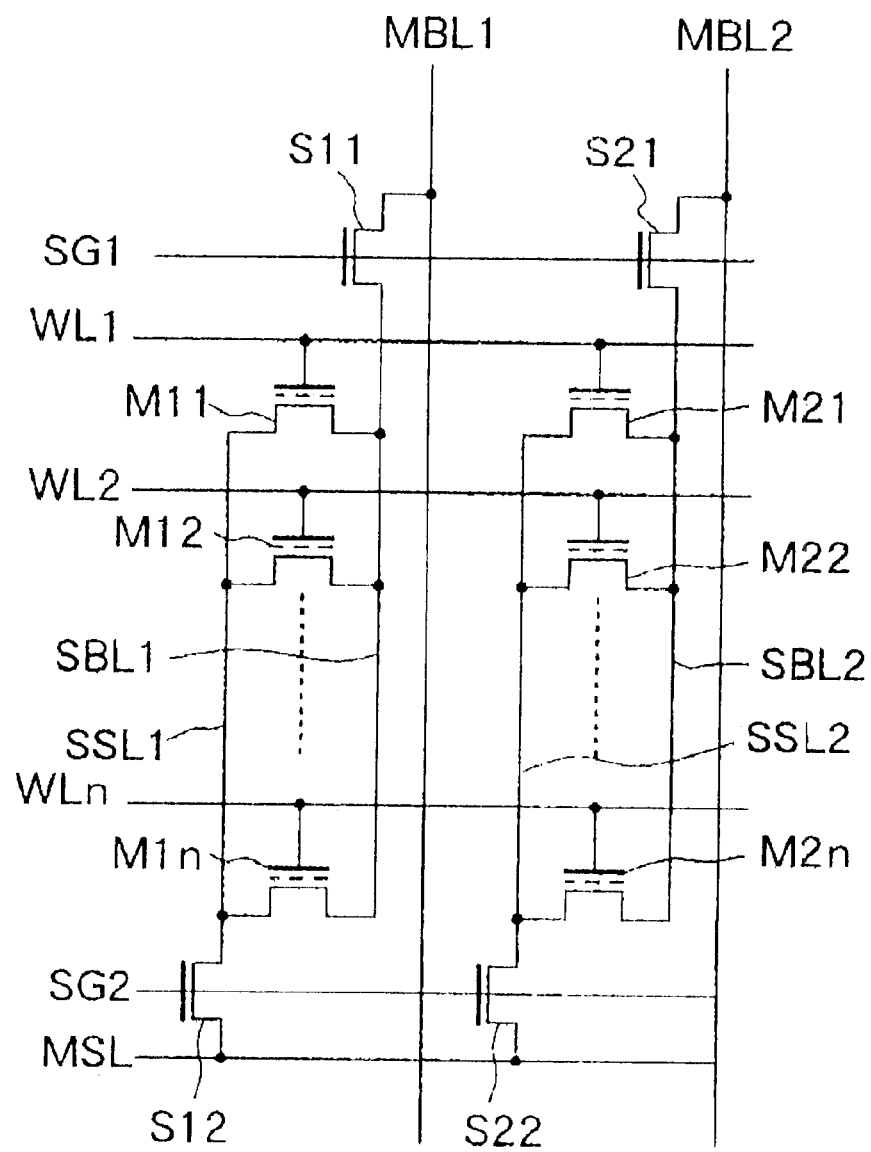
FIG. 2 is a circuit diagram of the schematic configuration of an AND type memory cell array according to an embodiment of the present invention.
Figure 3:
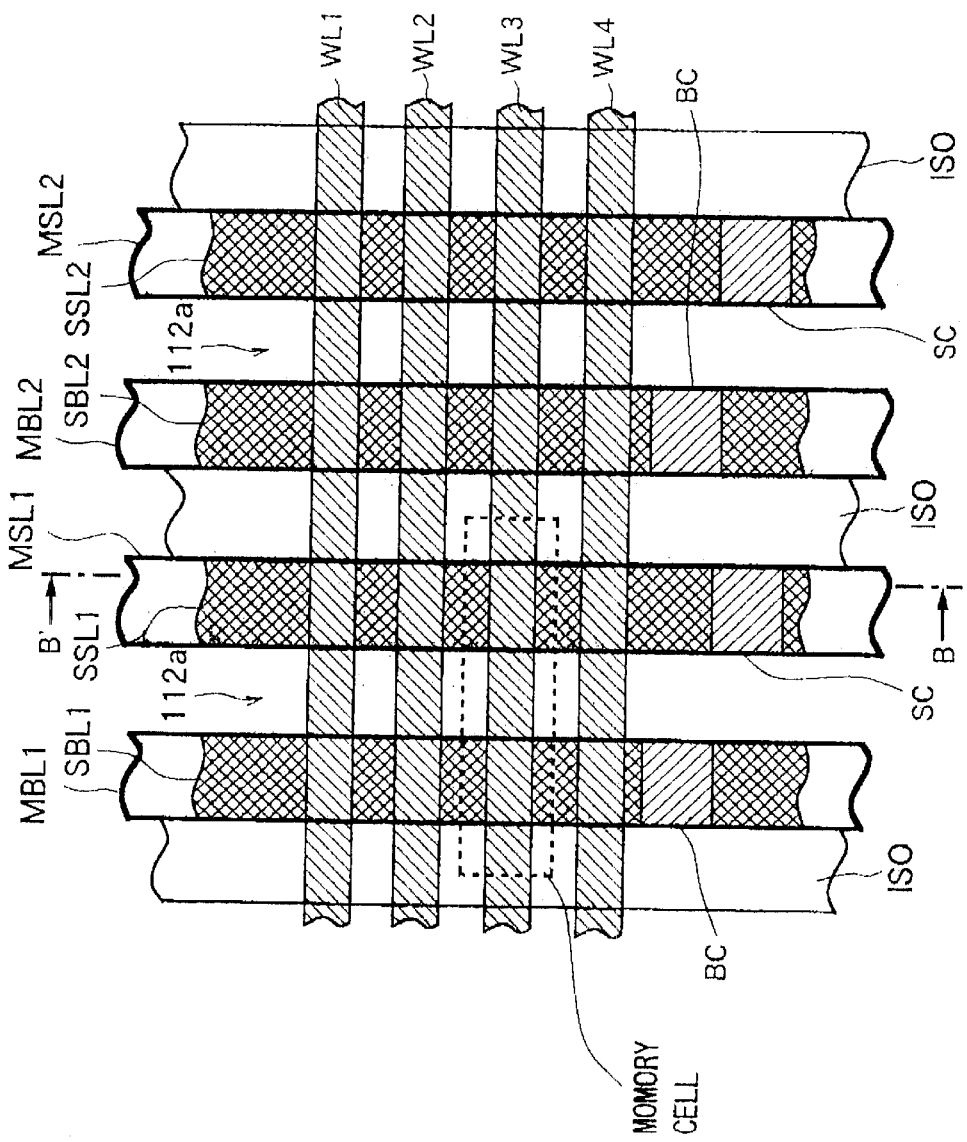
FIG. 3 is a plan view of the AND type memory cell array according to an embodiment of the present invention.
Figure 4:
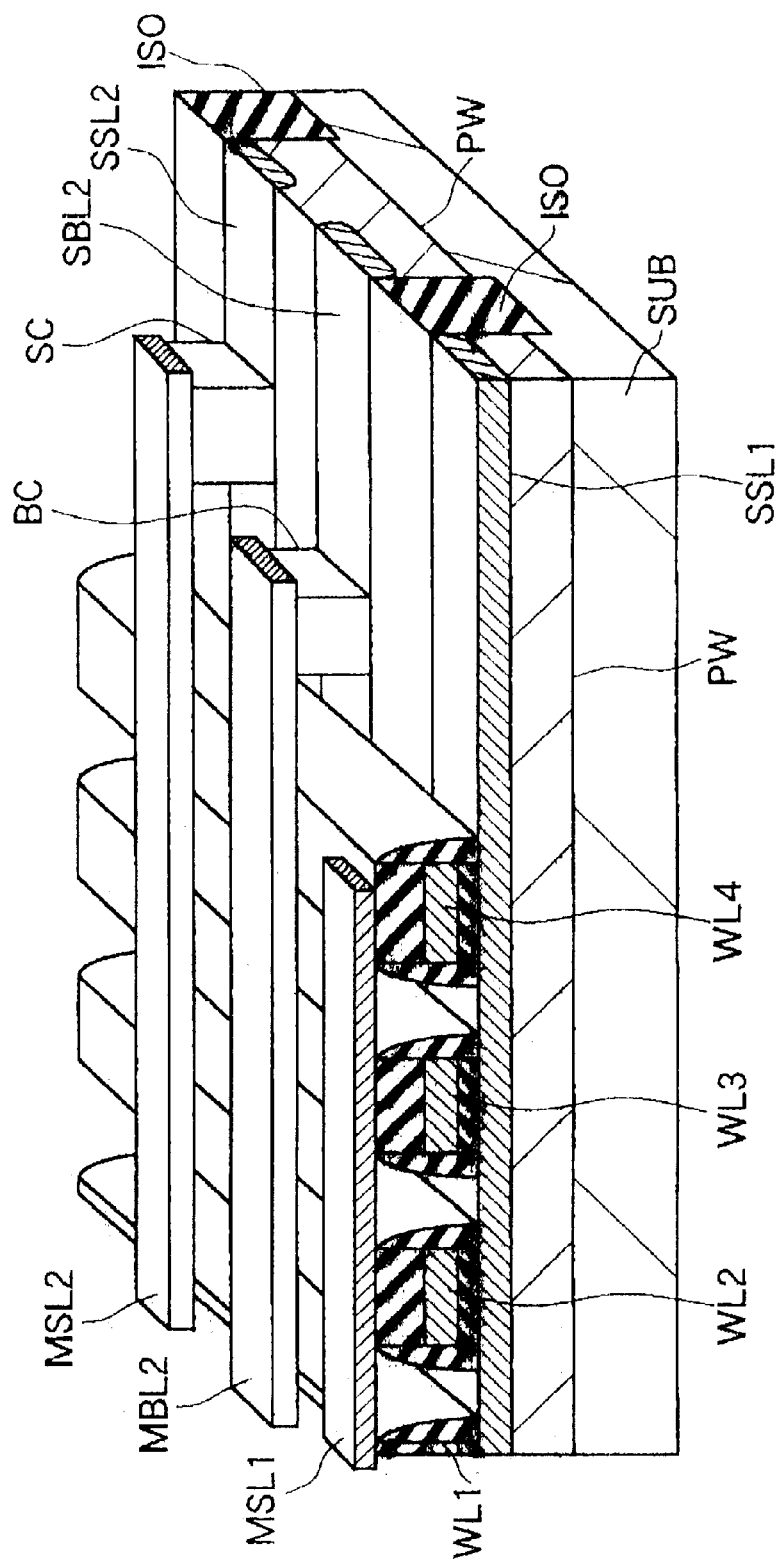
FIG. 4 is a bird's eye view of the AND type memory cell array according to an embodiment of the present invention seen from a cross-section taken along the line B—B' in FIG. 3.
Figure 5:
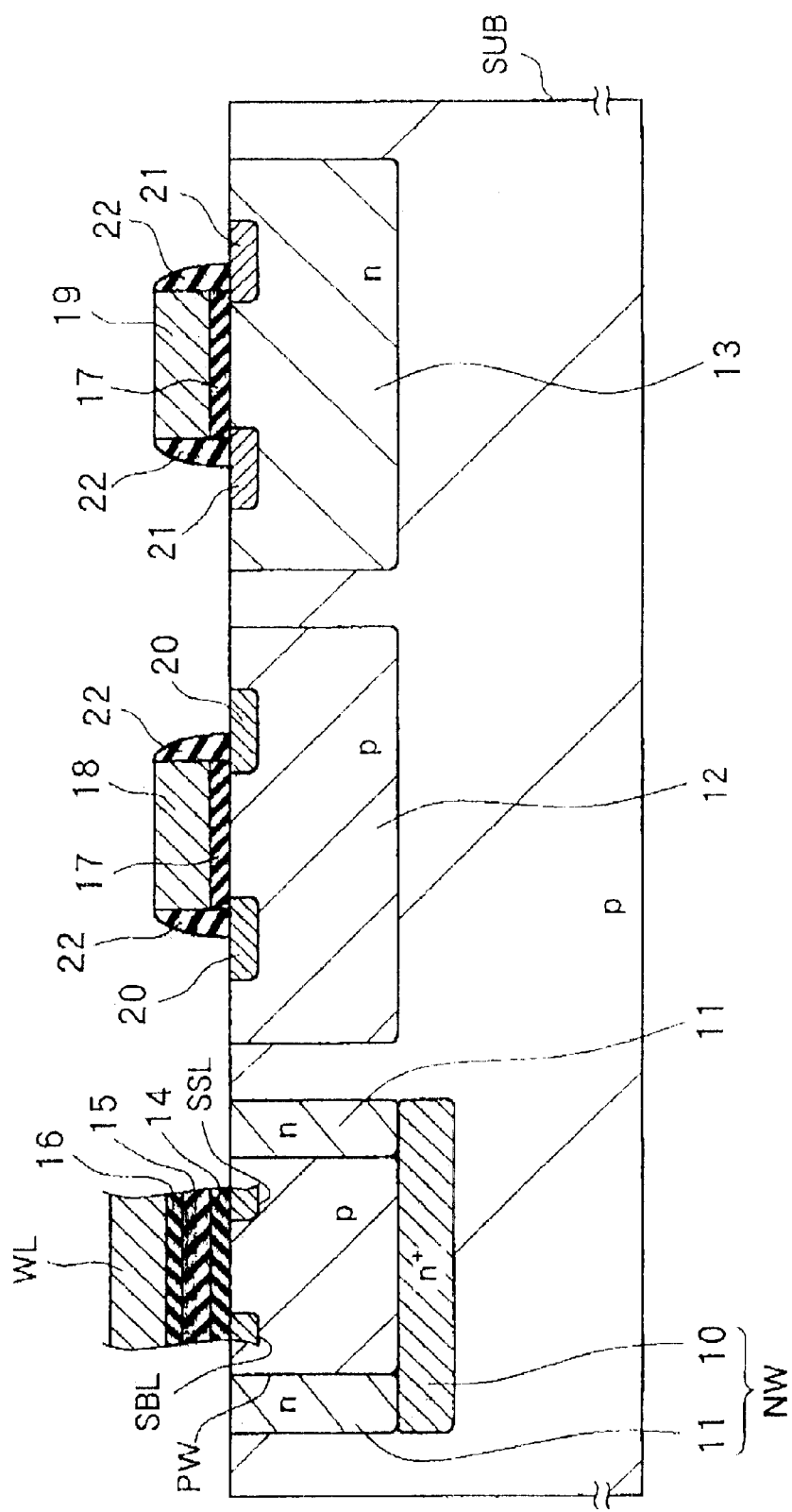
FIG. 5 is a sectional view of a memory transistor in the word line direction together with peripheral circuits and a logic circuit block in the AND type memory cell array according to an embodiment of the present invention.

FIG. 2 is a view of the schematic configuration of an AND type memory cell array according to an embodiment of the present invention. FIG. 3 is a plan view of the AND type memory cell array. FIG. 4 is a bird's eye seen from a cross-section taken along the line B—B' in FIG. 3. Also, FIG. 5 is a sectional view of a memory transistor in the word line direction together with a peripheral circuit and a logic circuit block in the transistor.

In the AND type memory cell array, bit lines are classified into a hierarchy of main bit lines and sub bit lines, and source lines are classified into a hierarchy of main source lines and sub source lines.

A main bit line MBL1 is connected to a sub bit line SBL1 via a select transistor S11, while a main bit line MBL2 is connected to a sub bit line SBL2 via a select transistor S21. Also, a main source line MSL (divided to MSL1 and MSL2 in FIG. 4) is connected to a sub source line SSL1 via a select transistor S12 and to a sub source line SSL2 via a select transistor S22.

Memory transistors M11 to M1n are connected in parallel between the sub bit line SBL1 and sub source line SSL1, and memory transistors M21 to M2n are connected in parallel between the sub bit line SBL2 and the sub source line SSL2. The (n) number of memory transistors connected mutually in parallel and the two select transistors (S11 and S12 or S21 and S22) compose a unit block (an AND column) comprising part of a memory cell array.

The gates of the memory transistors M11, M21, . . . adjacent in the word direction are connected to the word line WL1. In the same way, the gates of the memory transistors M12, M22, . . . are connected to the word line WL2, and the gates of the memory transistors M1n, M2n, . . . are connected to the word line WLn.

Select transistors S11, S21, . . . adjacent in the word direction are controlled by a select gate line SG1, while select transistors S12, S22, . . . are controlled by a select gate line SG2.

In the AND type cell array, as shown in FIGS. 4 and 5, a p-well PW is formed in the surface portion of the semiconductor substrate SUB. The p-well PW may be isolated at just its surface region, but here it is formed by burying an insulator in a trench and insulating and isolating it in the word line direction by element isolation insulation layers ISO arranged in parallel stripes. Also, while not illustrated in FIG. 4, the p-well PW is formed surrounded by an n-well NW. The n-well NW is formed, as shown in FIG. 5, by a deep $n^+$-type impurity region contacting the bottom surface of the p-well PW and n-type impurity regions contacting the side faces of the p-well PW.

In FIG. 4, the p-well portion isolated by the element separation insulation layers ISO serves as an active region of the memory transistor. N-type impurities are doped at a high concentration in separated parallel stripes at the two sides of the active region in the width direction. Due to this, the sub bit lines SBL1, SBL2 (hereinafter, indicated as SBL) and sub source lines SSL1 and SSL2 (hereinafter, indicated as SSL) are formed.

The word lines WL1, WL2, WL3, WL4, . . . (hereinafter indicated as WL) are arranged on the sub bit lines SBL and sub source lines SSL via an insulating film and perpendicularly interconnected them at even intervals. Furthermore, the word lines is made on the p-well PW and the element isolation insulation layers ISO via the insulating film including therein charge storing means.

In FIG. 5, the intersecting portion of the portion of the p-well between the sub bit line SBL and sub source line SSL and the word line forms a channel-forming region of the memory transistor. The portion of the sub bit line SBL contacting the channel-forming region functions as a drain, while the portion of the sub source line SSL contacting the same functions as a source. Note that a low concentration region called a lightly doped drain (LDD) may be provided at a position under the substrate surface close to the channel-forming region of the sub bit line SBL and the sub source line SSL.

On the channel-forming region is stacked a tunnel insulating film 14, a nitride film 15, a top insulating film 16, and a gate electrode (a word line WL) in that order.

As a tunnel insulating film 14, a silicon oxide film having a film thickness of about 2 to 5 nm formed by thermal oxidization on the surface of the well and the substrate is used. Also, all or part of the thermally oxidized silicon film may be nitrided.

The nitride film 15 is comprised of a silicon nitride film of for example 5 to 8 nm. The nitride film 15 is prepared for example by low-pressure CVD (LP-CVD), includes a large number of carrier traps in the film, and displays an electro conductive characteristic of the Frenkel-Poole (FP) type.

The top insulating film 16 has to form deep carrier traps at a high concentration near the boundary with the nitride film 15, therefore is formed for example by a thermal oxidization method or a high temperature chemical vapor deposited oxide (HTO) method.

The word line WL is comprised by doped polycrystalline silicon (doped poly-Si) made conductive by being doped with a high concentration of p-type or n-type impurities. The word line WL may be comprised by a stacked film of the doped poly-Si and a refractory metal silicide thereon.

As shown in FIG. 4, offset insulation layers are formed above the word lines WL. Note that the offset insulation layers are omitted in FIG. 5. Also, a sidewall insulation layers are formed on the sideface in the width direction of the word line perpendicularly intersecting the cross-sectional direction in FIG. 4.

These insulation layers are formed with bit contacts BC reaching the sub bit line SBL and source contacts SC reaching the sub source line SSL at predetermined intervals. The contacts BC and SC are provided for example for every 128 transistors in the bit line direction.

Further, the main bit lines MBL1, BL2, contacting the bit contacts BC and the main source lines MSL1, BL2, . . . contacting the source contacts SC are alternately formed in parallel stripes.

In the AND type cell array, bit lines and source lines are classified into a hierarchy, so that it is unnecessary to form a bit contact BC and a source contact SC for every memory cell. Therefore, basically, there is no variation in contact resistence itself. The bit contacts BC and the source contacts SC are provided for example for every 128 memory cells. When the contacts are not formed by self-alignment, however, the offset insulation layers and sidewall insulation layers are not necessary. In this case, a normal interlayer insulating film is stacked thick to bury the memory transistors, then contacts are opened by normal photolithography and etching.

Since there is almost no wasted space due to use being made of a pseudo contact-less structure wherein sub-lines (sub-bit lines and sub source lines) are formed in impurity regions, when the layers are formed with a minimum line width F of the limit of the wafer process, the structure can be produced by a very small cell area close to $8F^2$.

Also, since the bit lines and source lines are classified into a hierarchy and the select transistor S11 or S21 separates the parallel memory transistor group in a non-selected AND column from the main bit line MBL1 or MBL2, the load-capacitance of the main bit line is remarkably reduced. This is advantageous for higher speed and lower power consumption. Also, due to the select transistor S12 or S22, the main source line can be separated from the sub source lines and the load-capacitance can be made lower.

On the other hand, as shown in FIG. 5, the same types of transistors are formed for the peripheral circuits and logic circuit block on the same semiconductor substrate SUB. The transistors have a smaller necessary breakdown voltage than the $V_{pp}$-type transistors of the related art and are formed smaller to that extent. The same types of transistors are used for the peripheral circuits and the logic circuit block in order to make more of the production process the same and thereby obtain cost merits more than compensating for the increased area of the logic circuit block.

Specifically, as shown in FIG. 5, a p-well 12 is formed simultaneously with the p-well PW of the memory transistor and an n-well 13 is formed simultaneously with the n-type impurity region 11 of the memory transistor in the regions for forming the peripheral circuit or logic circuit block.

On the p-well 12, for example, a gate electrode 18 composed of polycrystalline silicon is formed via a gate insulating film 17 comprised of thermally oxidized silicon of about 12 to 15 nm. On the n-well 13 is formed a gate electrode 19 composed of polycrystalline silicon via a similar gate insulation layer 17.

On the surfaces of the p-well 12 at the two sides of the gate electrode 18 are formed n-type source and drain impurity regions 20. Also, on the surfaces of the n-well 13 at the two sides of the gate electrode 19 are formed p-type source and drain impurity regions 21.

On the two side faces of the stacked patterns of the gate electrodes 18 or 19 and the gate insulating films 17 are formed sidewall insulation layers 22 comprised of a silicon oxide based insulating film.

An offset insulation layers, while not specifically illustrated, formed in the same way as the memory transistor side on thus formed gate electrodes 18 and 19 of the transistors. The surfaces of these stuck layers and surroundings are covered by an insulating layer. Contacts for connecting to the source and drain impurity regions 20 and 21 are also formed. An interconnection layer is formed connected with the contacts from an aluminum interconnection layer the same as the main bit lines MBL and main source lines MSL of the memory transistors.

Figure 6A:
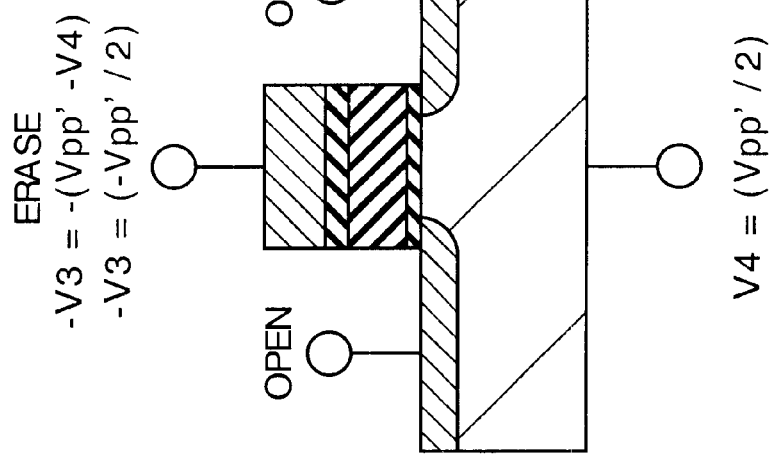
FIGS. 6A and 6B are views for explaining a method of writing and erasing a semiconductor device according to an embodiment of the present invention.
Figure 6B:
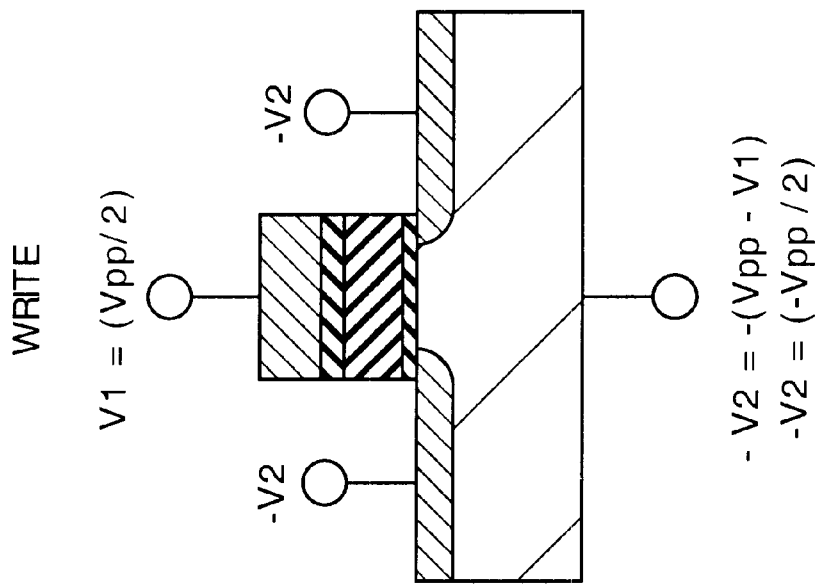

FIGS. 6A and 6B are views for explaining a method of writing and erasing a semiconductor device according to the present embodiment.

In the write method of the present invention, as shown in FIG. 6A, a write voltage $V_{pp}$ is divided into a first voltage V1 and a second voltage V2 (=$V_{pp}$-V1). The first voltage V1 is applied to the gate, while the second voltage V2 is applied to the well by an opposite polarity from the first voltage V1. At this time, the source and drain impurity region is held at for example the negative second voltage V2.

Also, in the erase method of the present invention, as shown in FIG. 6B, the erase voltage $V_{pp}'$ is divided to a third voltage V3 and a fourth voltage V4. The third voltage V3 (=$V_{pp}$-V4) is applied to the gate at an opposite polarity from the first voltage V1, while the fourth voltage V4 is applied to the well at an opposite polarity from the third voltage V3. At this time, the source and drain impurity regions are for example held at a floating state.

Due to this, the maximum value of the change in voltage of the gate electrodes or wells can be made smaller than that in the related art.

Note that when the write voltage and the erase voltage are the same, it is preferable to set V1=V2=V3=V4=$V_{pp}/2$ so as to make the maximum amplitude value of the voltage applied to the gate and well the smallest.

Below, to simplify the explanation, the write voltage and the erase voltage are made the same $V_{pp}$ and the divided voltages V1 to V4 are made $V_{pp}/2$.

Figure 7:
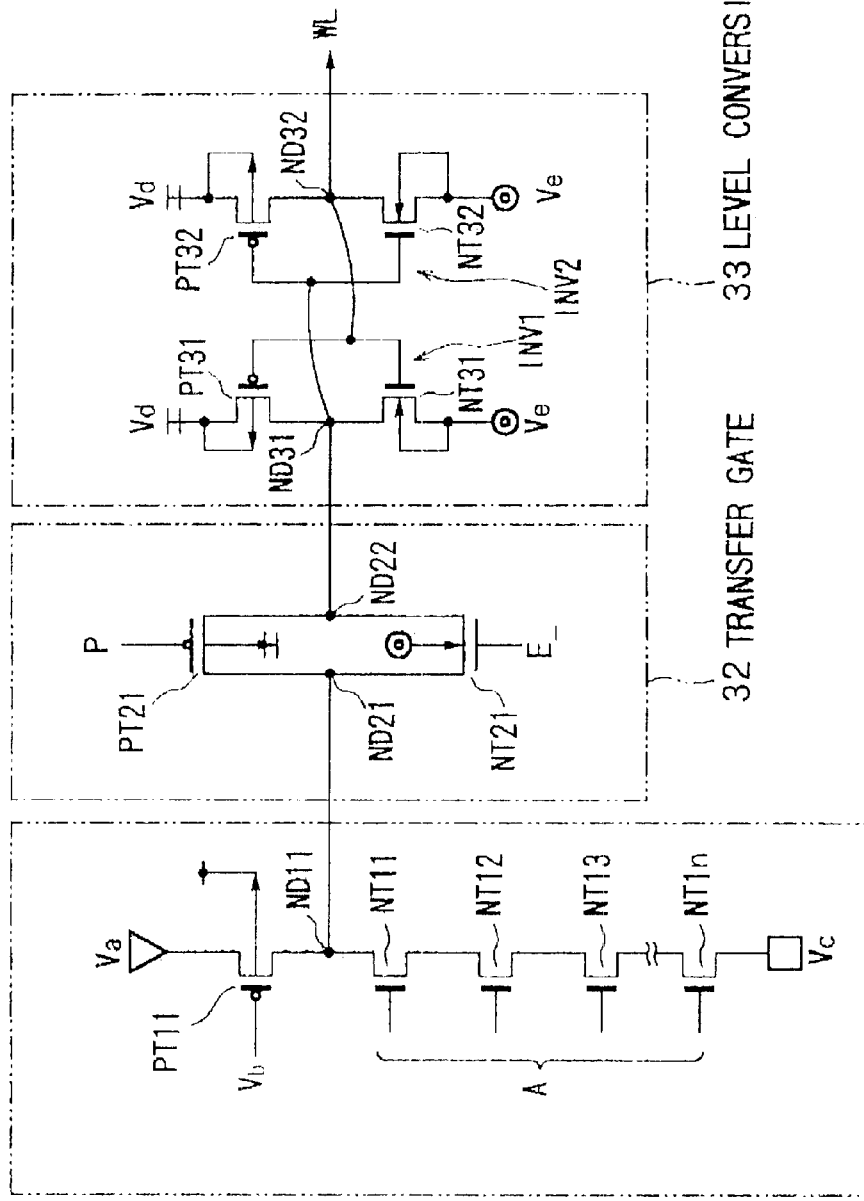
FIG. 7 is a circuit diagram of the configuration of key portions in a row decoder and a word line drive circuit as a specific example for carrying out a voltage application method of the present invention.

FIG. 7 is a circuit diagram of a core configuration in the row decoder 3 and word line drive circuit 8 as a specific example of the circuit for working such a voltage application method of the present invention.

The circuit shown in FIG. 7 comprises an address selection circuit 31, a transfer gate 32, and a level conversion circuit 33. In FIG. 7, Va, Vb, Vc, Vd, and Ve indicate a variety of control voltages generated from an external power source voltage $V_{cc}$ or a power source voltage $V_{cc}$ (hereinafter, simply referred to as a control voltage), P indicates a voltage of a write instruction signal, and E_ indicates a voltage of an inverted signal of an erase instruction signal.

The address selection circuit 31 comprises a p-channel MOS resistor PT11 and (n) number of n-channel MOS transistors NT11 to NT1n connected in series.

A source of the p-channel MOS transistor PT11 is connected to a supply line of the control voltage Va, the gate is connected to an input line of the control voltage Vb, and the drain is connected to the drain of the n-channel MOS transistor NT11.

Also, the sources of the series connected n-channel MOS transistors NT1n are connected to a supply line of the control voltage Vc, while the gates of the n-channel MOS transistors NT11 to NT1n are connected to an input line of an address signal A.

In the address selection circuit 31, an output node ND11 is configured by a connection midpoint of the drain of p-channel MOS transistor PT11 and the drain of n-channel MOS transistor. A signal in accordance with the levels of the control voltages Va, Vb and Vc, set to values corresponding to the operation modes, and a level in accordance with an input of the address signal A is output from a node ND11.

The transfer gate 32 is configured by a p-channel MOS transistor PT21 and an n-channel MOS transistor NT21 connected in parallel.

A well (channel) of the p-channel MOS transistor PT21 is connected to an input line of a positive divided voltage ($½V_{pp}$) of the write and erase voltage $V_{pp}$, while a gate is connected to an input line of the write instruction signal P.

On the other hand, a well of an n-channel MOS transistor NT21 is connected to an input line of a negative ½ divided voltage ($-½V_{pp}$) of the write and erase voltage $V_{pp}$, while a gate is connected to an input line of the inverted signal E_of an erase instruction signal.

Note that in FIG. 5, the n-channel MOS transistor NT21 may be of a double well structure the same as in the memory transistor, that is, formed in a p-well 12 surrounded by an n$^+$-type impurity region 10 and n-type impurity regions 11. When a double well structure is applied, a negative voltage is handled, so if a negative voltage is applied to a source and drain impurity region of the n-channel MOS transistor NT21, it is possible to prevent forward bias between the region and the substrate SUB.

An input node ND21 of the transfer gate 32 is connected to the output node ND11 of the address selection circuit 31, while an output node ND22 of the transfer gate 32 is connected to an input node ND31 of the level conversion circuit 33.

The level conversion circuit 33 comprises as its main components a CMOS inverter INV1 configured by connecting drains and gates of a p-channel MOS transistor PT31 and an n-channel MOS transistor NT31 and a cmos inverter INV2 configured by connecting drains and gates of a p-channel MOS transistor PT32 and an n-channel MOS transistor NT32. A connection midpoint (an input node ND 31) of drains in the inverter INV1 is connected to a connection midpoint of gates in the inverter INV2, and a connection midpoint of gates in the inverter INV1 is connected to a connection midpoint of drains (an output node ND32) in the inverter INV2.

Sources of the p-channel MOS transistors PT31 and PT32 are connected to the input line of the control voltage Vd, while sources of n-channel transistors NT31 and NT32 are connected to the input line of the control voltage Ve.

The n-channel MOS transistors NT31 and NT32 are preferably formed inside a double well structure in the same way as in the n-channel MOS transistor NT21 of the transfer gate 32.

Also, in the p-channel transistor PT32 and the n-channel MOS transistor NT32 comprising the inverter INV2, the connection midpoint of the two drains is connected to the word line WL as an output node ND32, and the inverter INV2 functions as a word line WL drive inverter. Therefore, the p-channel MOS transistor PT32 and the n-channel MOS transistor NT32 are set to be larger in size than other MOS transistors.

Next, the operation of the circuit configured as explained above will be explained with reference to the voltage condition table in FIG. 8.

At the time of a read or write operation, the control voltage Va is set to 5V, the control voltage Vb is set to 0 to 2V, and the control voltage Vc is set to 0V.

Here, when a word line WL is selected by the address signal A, the signal level output from the output node ND11 of the address selection circuit 31 becomes "low", while when not selected, it becomes "high".

On the other hand, at the time of an erase operation, the control voltage Va is set to 0V, the control voltage Vb is set to −2 to 0V, and the control voltage Vc is set to 5V.

At this time, when the word line WL connected to the circuit shown in FIG. 7 is selected, the signal level output from the output node ND11 becomes "high", while when not selected, it becomes "low".

As explained above, since the polarity of the power source voltage is inverted between a read or write operation and an erase operation, inversion of logic can be attained.

The output signal of the address selection circuit 31 is transferred to the level conversion circuit 33 via the transfer gate 32.

The control voltage Ve is set to 0V both at the time of a read and write operation. The control voltage Vd is set to a read gate voltage of 1 to 3V at the time of a read operation and a positive divided voltage ($V_{pp}/2$) at the time of a write operation.

Accordingly, when not selected, an input voltage of 5V is converted to a low level by the level conversion circuit 33 and transferred to the word line WL, whereupon the level of the word line WL becomes "low (=0V)".

Conversely, when selected, a positive voltage is output to the word line WL. Namely, the word line becomes 1 to 3V at the time of a read operation and ($V_{pp}/2$) at the time of a write operation.

As explained above, a signal of 0V/5V from the address selection circuit 31 is converted to 1 to 3V, ($V_{pp}/2$) or 0V in the level conversion circuit and output to the word line WL.

At the time of an erase operation, the control voltage Vd is set to 0V and the control voltage Ve is set to a negative divided voltage ($-V_{pp}/2$).

At the time of an erase operation, when a word line is not selected, the signal level output from the output node ND11 of the address selection circuit 31 becomes "low", that is 0V, and a high level control voltage Vd is output from the level conversion circuit 33 to the word line WL. Accordingly, the non-selected word lines are held at the ground potential in the erase mode.

On the other hand, when a word line is selected in an erase operation, the signal level output from the output node ND11 of the address selection circuit 31 becomes "high", that is, 5V, and a low level control voltage Ve is output to the word line WL by the level conversion circuit 33. Accordingly, the selected word line becomes a negative voltage of ($-V_{pp}/2$) in the erase mode.

The transfer gate 32 is provided to prevent the potential of ($V_{pp}/2$) or ($-V_{pp}/2$) of the output node ND22 from leaking to the input node ND21 side during the operation.

For example, at the time of a write operation, the output node ND22 could become ($V_{pp}/2$), but at this time, $P=V_{pp}/2$ is applied to the gate of the p-channel MOS transistor PT21 as shown in FIG. 8, thus, the p-channel MOS transistor PT21 turns off.

On the other hand, the n-channel MOS transistor NT21 receives at its gate an inverted signal E_ of the erase instruction signal E at the time of a write operation. Even if on, the node ND21 cannot become higher than the 5V received at the gate.

Accordingly, even when ($V_{pp}/2$) is higher than 5V, ($V_{pp}/2$) never enters from the node ND22 to the ND21 side.

Next, while the node ND22 sometimes becomes ($-V_{pp}/2$) at the time of an erase operation, the n-channel MOS transistor NT21 turns off because the gate receives ($-V_{pp}/2$) the same as the channel at the time of an erase operation.

Accordingly, the negative voltage ($-V_{pp}/2$) never enters the node ND21 side through the n-channel MOS transistor NT21.

Also, the p-channel MOS transistor PT21 turns on by receiving 0V at the gate at the time of an erase operation, but the node ND21 side does not become a lower voltage than that 0V.

Therefore, there is no possibility of the negative voltage being transmitted from the node ND22 to the node ND21.

As explained above, in the circuit in FIG. 7, the word line WL is directly driven by the level conversion circuit 33, so the transfer speed of the word signal does not decline, and voltages of different levels can be supplied at a high speed to the word line WL in accordance with the operation modes.

Finally, an example of the method of production of a semiconductor device according to the present embodiment will be explained.

FIGS. 9 to 13 are sectional views of steps in the production of this semiconductor device. FIG. 14 is a table of photo masks used in producing the semiconductor device.

First, a p-type silicone wafer or other semiconductor substrate SUB is prepared, and an element isolation insulation layer ISO (FIGS. 3 and 4) is formed on the semiconductor substrate SUB for example by a trench isolation method. In forming the element isolation insulation layer ISO, an etching mask layer is formed on the substrate, and the substrate is etched to a predetermined depth by anisotropic etching. Then, the trenches are buried with an insulator. In this state, part of the insulator on the surface of the substrate between the trenches is removed by for example etching using a resist as a mask, then chemical mechanical polishing (CMP) is performed. The insulator is partially removed so as to remove in advance the majority of the insulating film projecting out between the trenches and leave only the edges of the projecting portions before CMP so as to correct problems due to the difference of areas since the polishing amount depends on the area of the projecting portions of the insulating film and dishing and other unevenness of polishing may occur at projecting portions of large areas during CMP.

In the table of FIG. 14, a first mask "TRE" is a photo mask for forming a trench etching mask layer, and a second mask "AIM" is a photo mask for removing part of a buried insulating film.

Figure 9:
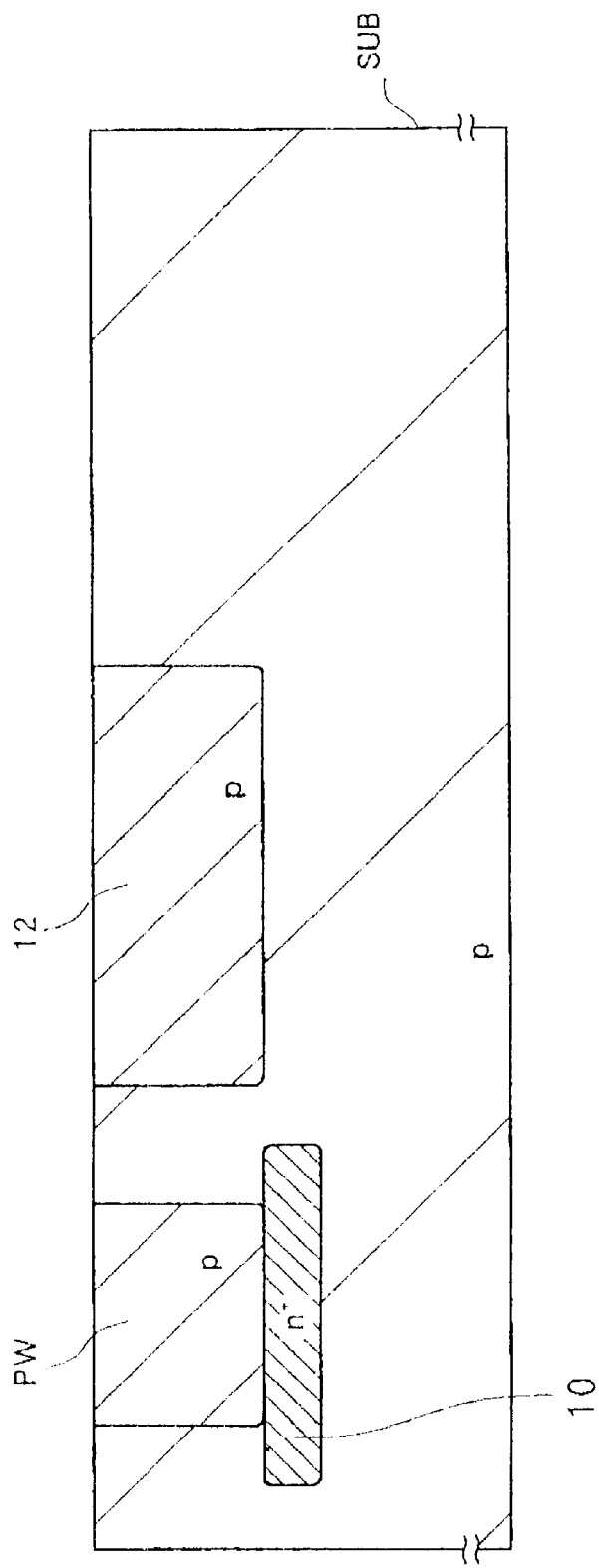
FIG. 9 is a sectional view after forming a p-well in production of a semiconductor device according to the present invention.

Next, as shown in FIG. 9, a third mask "DNW" is used for forming a resist pattern on the semiconductor substrate SUB. Ion implantation is performed by using the resist pattern as a mask and a deep n$^+$-impurity region 10 is formed at the deep portion of the substrate below the opening of it.

The resist pattern is removed, then p-wells are formed by forming a resist of a different pattern and performing an ion implantation of a different condition. A fourth mask "PWL" is used for patterning the resist at this time. As a result, the p-wells PW for memory transistors and the p-wells 12 for peripheral circuits and logic circuits are simultaneously formed on different regions on the wafer.

Figure 10:
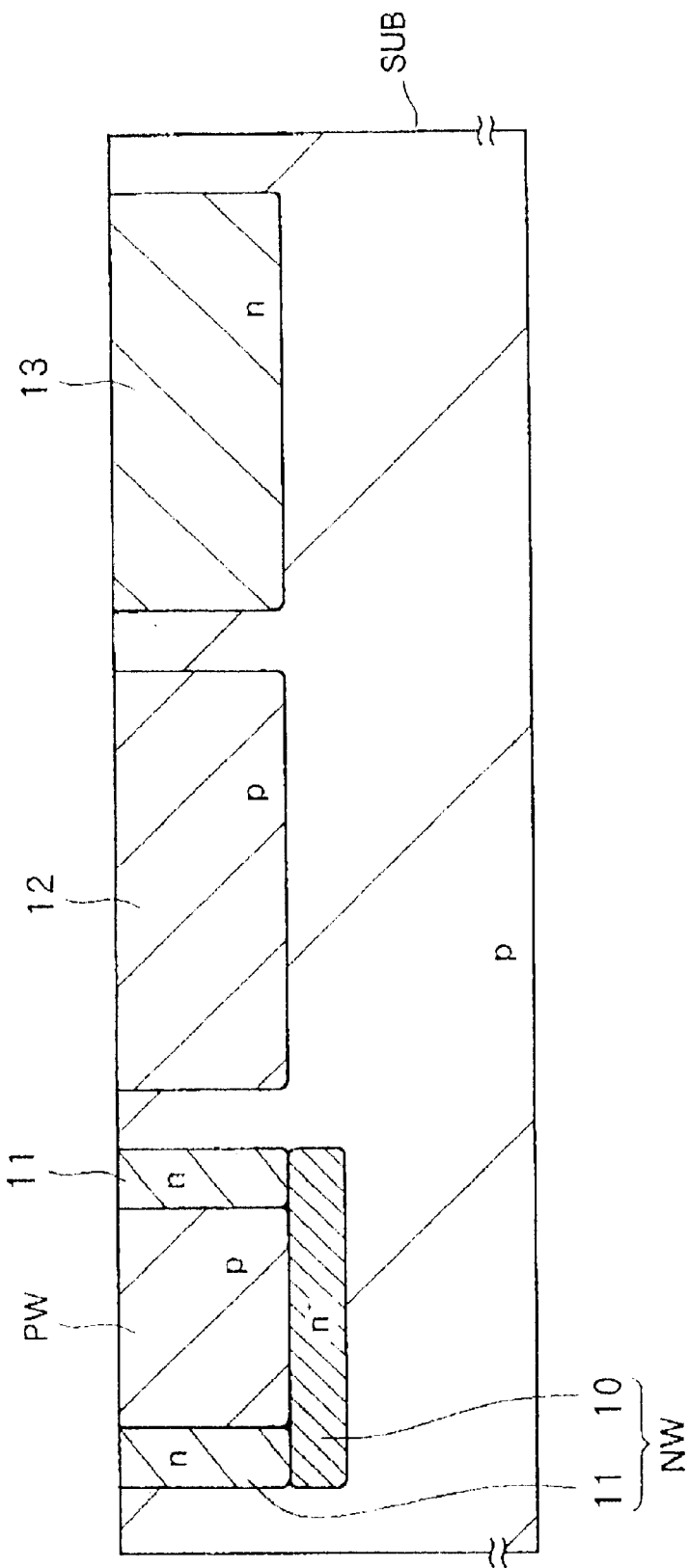
FIG. 10 is a sectional view continued from FIG. 9 after forming an n-well.

The resist is removed, then, as shown in FIG. 10, a resist of a different pattern is formed and ion implantation of a different condition is performed by the same procedure to form n-wells. A fifth mask "NWL" is used for patterning the resist at this time. As a result, n-wells NW for memory transistors are formed around the p-wells PW, and n-wells 13 for peripheral circuits and logic circuits are formed on different regions at the same time.

The resist is removed, then formation of a resist by a different pattern and ion implantation of a different condition are repeated twice to adjust the threshold voltages of the memory transistors and select transistors. A sixth mask "MVA" is used for adjusting the threshold voltage of the memory transistors, and a seventh mask "SEL-VA" is used for adjusting the threshold voltage of the select transistors.

Figure 11:
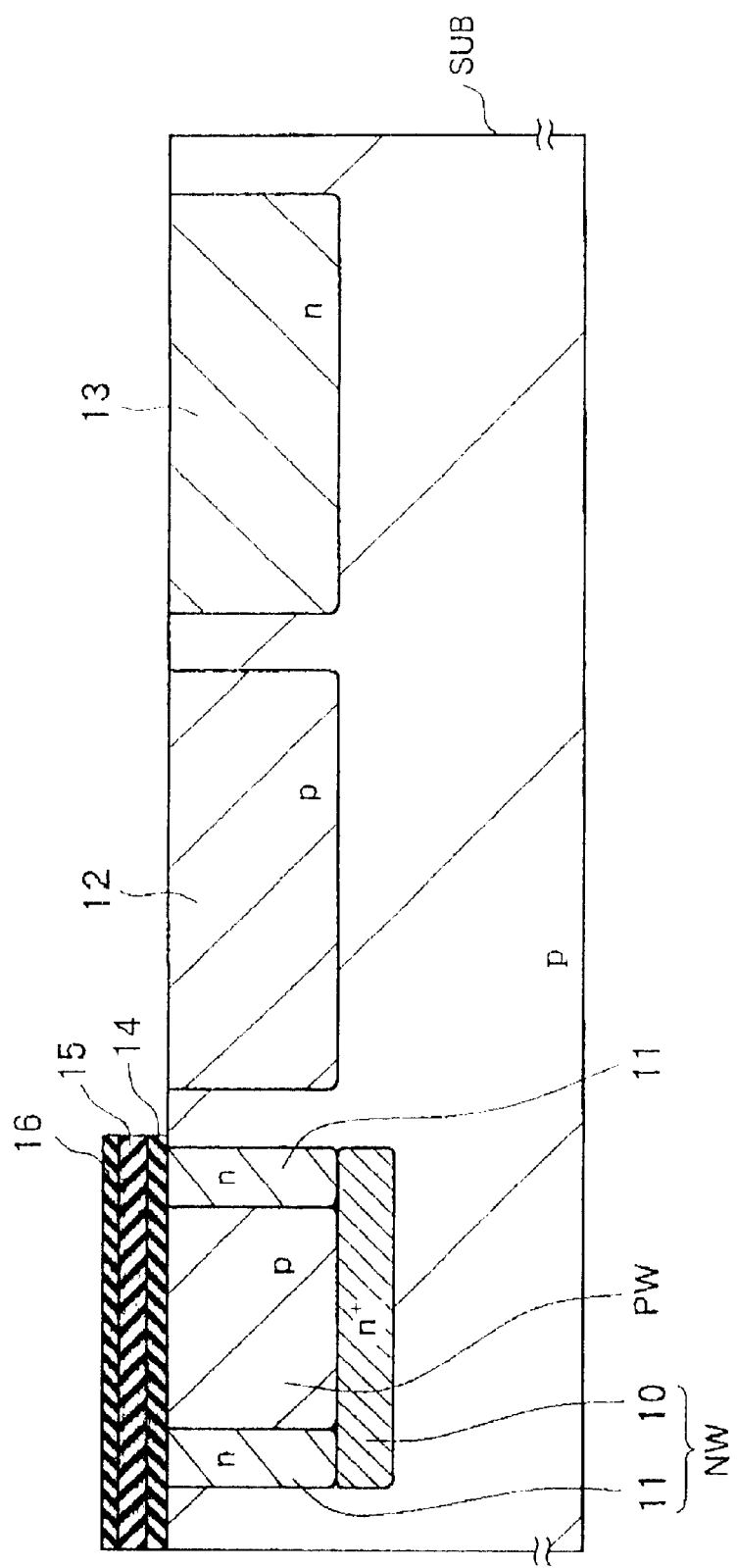
FIG. 11 is a sectional view continued from FIG. 10 after removing part of an ONO film.

In the step shown in FIG. 11, an ONO film is formed over the entire surface. Namely, a tunnel insulating film 14 comprised of silicon oxide is formed by thermal oxidization, and a nitride film 15 is stacked thereon by the LP-CVD method etc. Then, a top insulating film 16 is formed either by thermal oxidization on the surface of the nitride film 15 or by forming an HTO film on the nitride film 15.

On the formed ONO films 14, 15, and 16 is formed a resist pattern covering the memory transistor regions by using an eighth mask "GTET(ONO-ET)". Using the resist as a mask, the ONO films on the peripheral circuit and logic circuit side are removed by etching.

Figure 12:
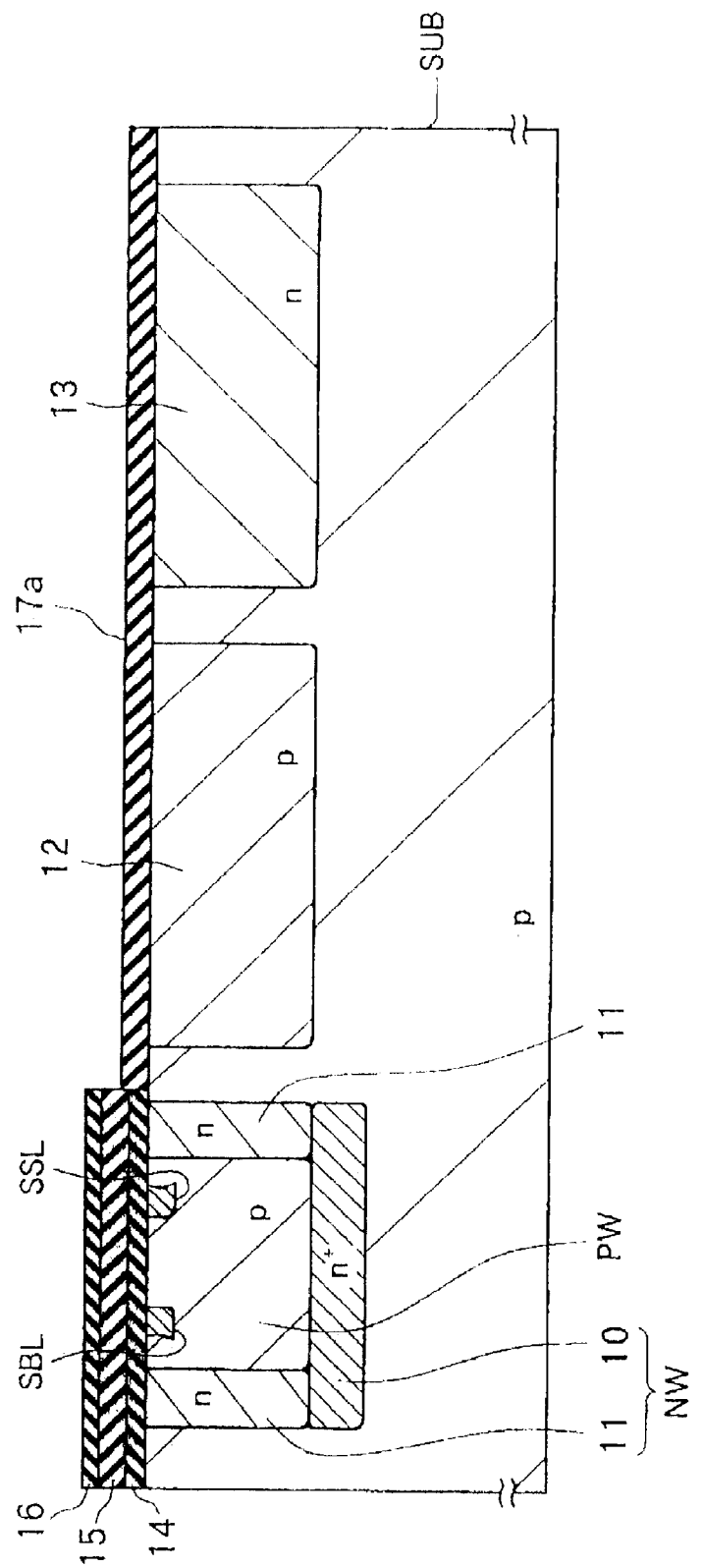
FIG. 12 is a sectional view continued from FIG. 11 after forming sub source lines and sub bit lines.

The resist is removed, then, as shown in FIG. 12, the exposed surfaces of the substrate and wells are thermally oxidized to 10 or so nm to form a gate insulating film 17a common for the peripheral circuits and logic circuits.

In this state, a resist pattern is formed on active regions of the p-wells of the memory transistors sandwiched by element isolation insulation layers ISO by using a ninth mask "BN" and ion implantation is performed. As a result, sub bit lines SBL and sub source lines SSL comprised by n$^+$-impurity regions are formed in long parallel stripes in the bit line direction.

Then, resist is formed using a 10th mask "BN2(N+II)" and ion implantation is performed for additional implantation of impurities to part of the sub bit lines SBL and sub source lines SSL, for example, to a length of half the side where the bit contacts are formed. As a result, even when the number of transistors on the AND column is as large as 128, the variation in the transistor characteristics due to the interconnection resistance of the impurity regions is reduced.

Figure 13:
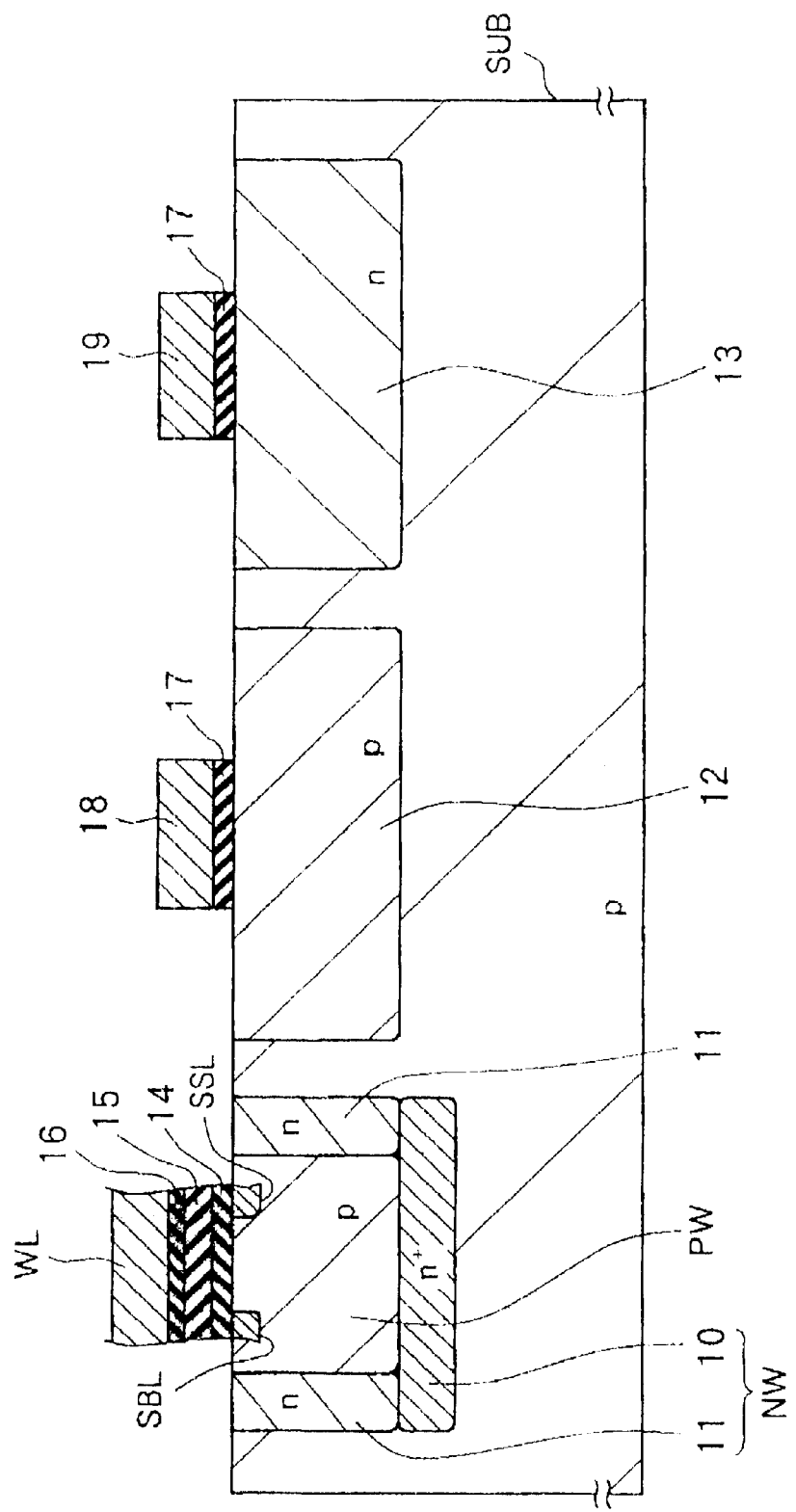
FIG. 13 is a sectional view continued from FIG. 12 after forming word lines and gate electrodes.

The resist is removed, then, at the step of FIG. 13, a gate conductive film comprised of polycrystalline silicon is formed on the entire surface. A resist is formed on this using an 11th mask "IPS", then anisotropic etching is performed to form the word lines WL and gate electrodes 18 and 19.

The resist is removed, then a resist for opening only the memory transistor regions is formed by using a 12th mask "Ch-stp". The resist is used as a mask for shallow ion implantation of p-type impurities. At this time, the word lines WL and element isolation insulation layers ISO functions self-alignment masks and p-type impurity regions for channel stop are formed on the p-well surfaces between the word lines WL.

The resist is removed, then a resist for opening the area around the gate electrodes on the n-MOS side of the peripheral circuits and logic circuits is formed by using a 13th mask "HV-NLD" and ion implantation is performed. As a result, as shown in FIG. 5, n$^+$-type source and drain impurity regions 20 for the n-MOS transistors of the peripheral circuits and logic circuits are formed.

Similarly, p$^{30}$-type source and drain impurity regions 21 on the p-MOS side are formed by using a 14th mask "HV-PLD".

Next, while not particularly illustrated, source and drain impurity regions of still higher concentrations are formed by using a 15th mask "NSD" and the 16th mask "PSD" respectively on the n-MOS side and p-MOS side of the peripheral circuits and logic circuits. When introducing n-type impurities in a high concentration, the impurities are additionally implanted to portions on which contacts of memory transistors are formed for reduction of the contact resistance.

Next, bit contacts and source contacts are simultaneously formed by using a 17th mask "1AC", the main bit lines MBL, main source lines MSL, and other interconnections are formed by using an 18th mask "1AL", an overcoat film is formed, and electrode pads are opened by using a 19th mask "PAD" so as to complete the semiconductor device.

Figure 15:
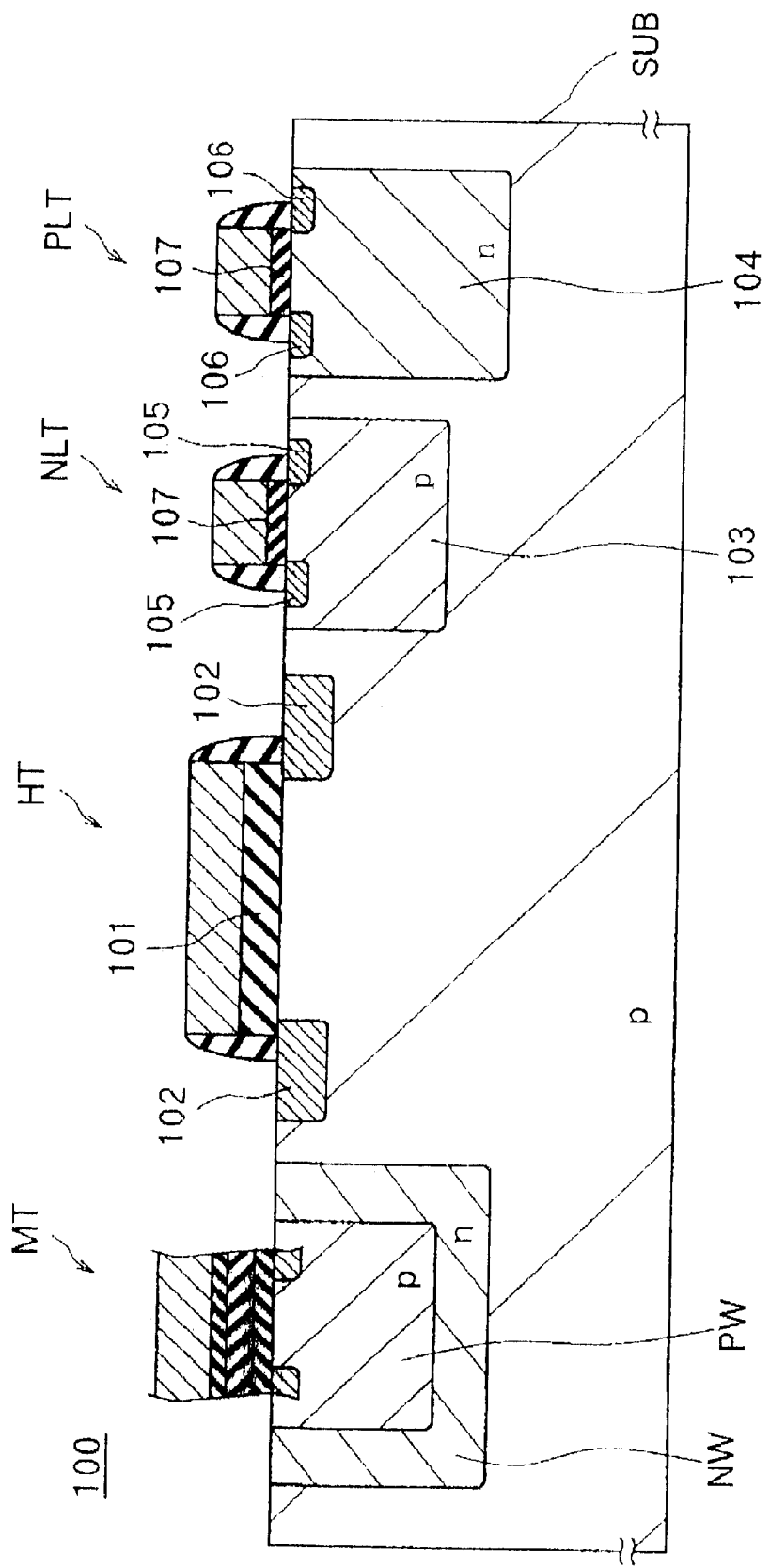
FIG. 15 is a sectional view of the configuration of a semiconductor device produced in a method of production of the related art as a comparative example.

FIG. 15 is a sectional view of the configuration of the semiconductor device produced by the method of production of the related art as a comparative example. FIG. 16 is an explanatory view of the relationship of a gate length and a gate width as transistor size changes.

In the semiconductor device 100, the memory transistor MT has a double well structure and is basically the same as those in the present embodiment, but high breakdown voltage transistors HT are necessary for applying a full range of a write voltage $V_{pp}$ or an erase voltage $V_{PP}'$ to the word lines.

The high breakdown voltage transistor HT shown in FIG. 15 has to have a gate insulating film having a film thickness of 20 nm or more. One with a gate length over 1 $\mu$m is used. Also, the source and drain impurity region 102 is required to be formed deep in the substrate with a gentle gradient of concentration since it is necessary to increase the junction breakdown voltage. Thus, the annealing conditions for forming such a deep impurity region differ considerably from those in forming impurity regions in other cases, so it is extremely difficult to form the same simultaneously with forming source and drain impurity regions of other transistors.

On the other hand, low breakdown voltage high speed transistors for logic circuits are formed on the wells 103 or 104 having respectively optimized concentrations with the n-MOS transistors NLT and p-MOS transistors PLT, and the source and drain impurity regions 105 and 106 are made higher in concentration and thinner to their limits. Further, the gate insulating film thickness is scaled to 3 to 8 nm and the gate length is scaled to about 0.25 $\mu$m.

In the semiconductor device according to the present embodiment, by dividing the method of application of voltage to the word lines WL and wells PW separately by positive and negative polarities, for example, it is possible to reduce the voltage applied between the sources and drains of the transistors comprising the inverter of the level conversion circuit 33 of the circuit in FIG. 7 to half of that in the related art. Accordingly, the thickness of the gate insulating film and the gate length can be scaled down by that amount.

Figure 16A:
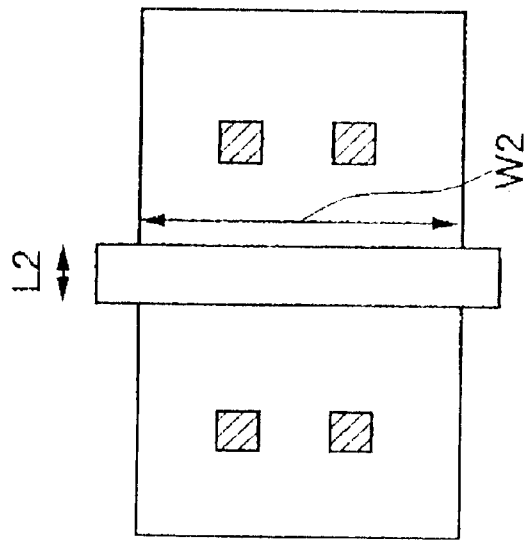
FIG. 16A and FIG. 16B are explanatory views of the relationship of a gate length and a gate width when changing a transistor size.
Figure 16B:
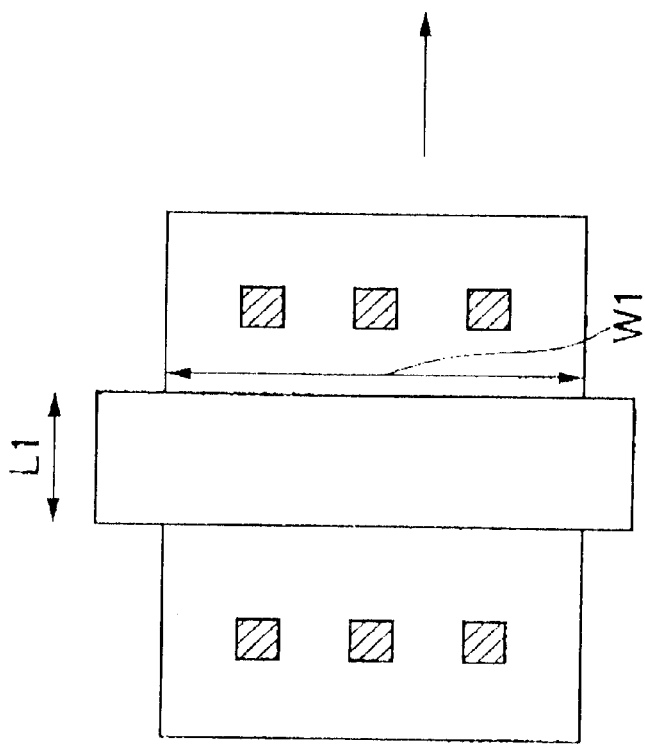
Figure 17A:
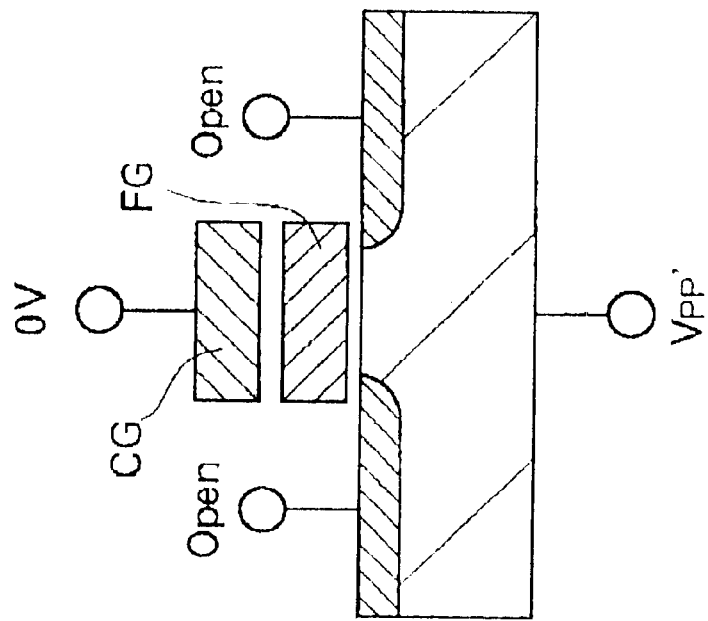
FIG. 17A and FIG. 17B are schematic views of a general method of setting bias at the time of a write and erase operation on a memory transistor in a FG type semiconductor device of the related art.
Figure 17B:
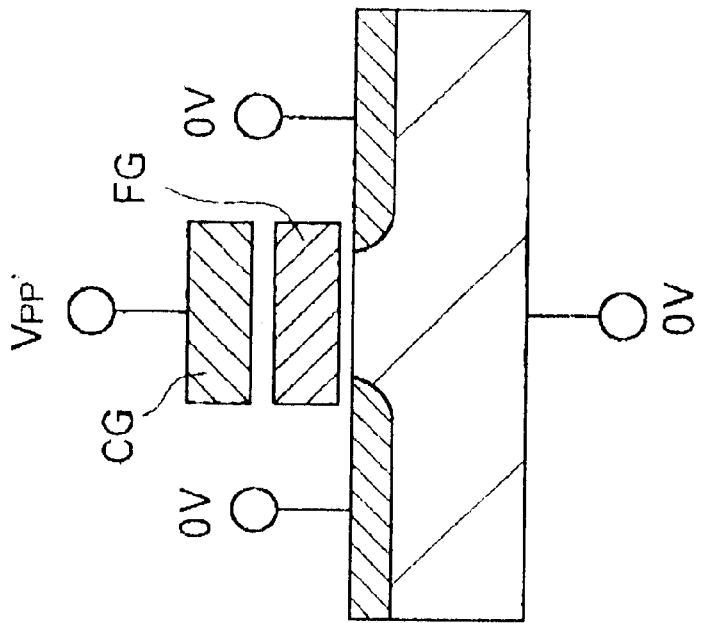

As shown in the formulas of FIG. 16A and FIG. 16B, the drain current Id is proportional to W/L both for a linear region and saturation region. Thus, when assuming the same drive ability, if the gate length L is made shorter, the gate width W can also be made shorter by the same ratio. As a result, if halving the voltage applied to a transistor, the lower gate electrode area can be made about ¼ from simple calculation, and transistors made smaller by that amount can be used.

In the logic circuit block, conversely, transistors previously optimized and made smaller in the related art end up becoming larger in size. Normally, since there is a large number of transistors in the logic circuit block, the area becomes somewhat larger as a whole.

However, the semiconductor device of the present embodiment becomes much simpler in production process compared with the related art.

Specifically, the special masks required in the method of production of the related art are added in the column at the right end of the mask table of FIG. 14.

First, as the fourth and fifth masks, "LV-PWL" for forming p-wells 103 and "LV-NWL" for forming n-wells 104 are necessary. Two more steps of formation of a resist pattern and ion implantation are also necessary.

Also, after forming the gate insulating film 101 of the high breakdown voltage transistor HT, the 11th mask "2GTET (HV-OX-ET)" for removing the film on the logic circuit block side is necessary. At this time, one more step of formation of a resist pattern and anisotropic etching are also added.

In order to improve the performance of the transistors for the logic circuits, gate electrodes have to be divided to the n-type on the n-MOS side and p-type on the p-MOS type. Accordingly, "NGT" and "PGT" for alternately protecting one side are necessary as the 15th and 16th masks. At this time, two more steps of formation of a resist pattern and ion implantation are added.

Further, it is necessary to separately form exclusive source and drain impurity regions 105 and 106. Thus, "LV-NLD" and "LV-PLD" are necessary as 20th and 21st masks. At this time, two more steps of formation of a resist pattern and ion implantation are added.

As seen from the above, in the method of production of a semiconductor device according to the present embodiment, by simultaneously forming memory transistors of memory peripheral circuits and logic circuits by the same size, while the chip area becomes a little larger, there are the advantages that the production process becomes simple and the yield can be easily improved due to the method of production including many common steps. Specifically, in the above example, seven masks, seven steps of formation of resist patterns, six steps of ion implantation, and one step of anisotropic etching become unnecessary.

As a result, by using the method of production according to the present embodiment, it is possible to obtain cost merits more than compensating for the drawback of increased area.

When actually calculating the costs, it was confirmed that a 25 percent reduction of the chip cost was possible comparing with an MONOS type semiconductor memory device produced by the method of the related art.

Further, while not considered in the above calculation, in a MONOS type non-volatile memory device as in the present embodiment, since the write and erase voltages are much lower than in the FG type, it is sufficient to generate a negative voltage by converting from the power source voltage $V_{cc}$ and therefore an internal booster becomes unnecessary. Accordingly, further cost reduction becomes possible.

Note that needless to say the present invention may also be applied to FG type transistors. Further, it may also be applied to other types of transistors with discrete charge storing means such as fine nanocrystal type, fine divided FG type, and MNOS type transistors.

Furthermore, it is not limited to a memory cell array configuration of the AND type and may be applied to other NOR type and NAND type arrays.

Summarizing the effects of the invention, the semiconductor device and the drive method according to the present invention have the advantage that the required breakdown voltage of the transistors in the peripheral circuits of memory cell array can be sharply reduced and, as a result, the areas of the peripheral circuits can be made smaller.

Also, with the method of production of a semiconductor according to the present invention, by simultaneously forming memory transistors of memory peripheral circuits and logic circuits in the same size, while the chip area becomes somewhat larger in some cases, there is the advantage that the production process is simpler due to the high degree of compatibility of the production process and the yield can be improved. Accordingly, the chip cost can be reduced.

While the invention has been described with reference to a specific embodiment chosen for purpose of illustration, it should be apparent that numerous modifications could be made thereto by those skilled in the art without departing from the basic concept and scope of the invention.

What is claimed is:

1. A semiconductor device comprising:
   a memory transistor formed by stacking a gate electrode above a semiconductor substrate or a well with an insulating film therebetween and further including a charge storing means; and
   a write and erase circuit for supplying a write voltage or an erase voltage between said gate electrode and said semiconductor substrate or well for performing a write or erase operation on the memory transistor;
   wherein said write and erase circuit comprises;
   a means for dividing an applied voltage to a first and a second voltage and supplying the first voltage to said gate electrode a write operation and for generating third and a fourth voltages and supplying the third voltage at an opposite polarity from said first voltage to said gate electrode for performing an erase operation; and
   a means for applying said second voltage at an opposite polarity from the time of applying said first voltage to said semiconductor substrate or well during a write operation and applying said fourth voltage at an opposite polarity from the time of applying said third voltage to said semiconductor substrate or well during an erase operation.

2. A semiconductor device as set forth in claim 1, wherein said first voltage and second voltage are the same; and said third voltage and fourth voltage are the same.

3. A semiconductor device as set forth in claim 1, wherein said semiconductor device further comprises:
   a level conversion circuit for switching to provide an output of said first voltage and said second voltage or said third voltage and said fourth voltage; and
   wherein said level conversion circuit has transistors that have a breakdown voltage corresponding to a value of a power source voltage input from the outside.

4. A semiconductor device as set forth in claim 1, wherein said write and erase circuit has transistors that have a breakdown voltage corresponding to the value of a power source voltage input from the outside.

5. A semiconductor device as set forth in claim 1, further comprising:
   a memory block having of a memory cell array including a plurality of said memory transistors and a peripheral circuit including said write and erase circuit, and
   a logic circuit block;
   wherein:
   said peripheral circuit has transistors and said logic circuit block has logic transistors; and
   said transistors and logic transistors have breakdown voltages corresponding to the value of a power source voltage input from the outside.

6. A semiconductor device as set forth in claim 1, wherein:
   said write and erase circuit is provided within a peripheral circuit for controlling said memory transistor; and
   said write and erase circuit has transistors being set in conditions of at least the gate insulating film thickness and distribution of impurity concentration of source and drain regions and channel-forming region in said semiconductor substrate or well to be the same other transistors in said peripheral circuit.

7. A semiconductor device as set forth in claim 1, further comprising:
   a memory block having a memory cell array including a plurality of said memory transistors and a peripheral circuit including said write and erase circuit; and
   a logic circuit block;
   wherein:
   said peripheral circuit has transistors and said logic circuit block has logic transistors; and
   a thickness of a gate insulating film of the transistors in said write and erase circuit is set to be the same as a thickness of the gate insulating film of other transistors in said peripheral circuit and the logic transistors in said logic circuit.

8. A semiconductor device as set forth in claim 1, wherein:
   a plurality of insulating films are stacked between said gate electrodes and said well; and
   planarly dispersed charge storing means are formed in the stacked insulating films.

9. A method of driving a semiconductor memory by supplying a write voltage or an erase voltage between a gate electrode and a semiconductor substrate or well,
   said method including: the steps of, for performing a write operation;
   dividing an applied voltage to a first and a second voltage;
   applying the first voltage to said gate electrode; and
   applying said second voltage at an opposite polarity from when applying said first voltage to said well; and
   for performing an erase operation;
   dividing an applied voltage to a third and a fourth voltage;
   applying the third voltage at an opposite polarity from when applying the first voltage to said gate electrode; and
   applying the fourth voltage at an opposite polarity from when applying said second voltage to said well.

10. A method of driving a semiconductor device as set forth in claim 9, wherein:
    said first voltage and second voltage are set the same; and
    said third voltage and fourth voltage are set the same.

* * * * *